United States Patent [19]

Gorfinkel et al.

[11] Patent Number: 5,274,225
[45] Date of Patent: Dec. 28, 1993

[54] METHOD OF AND MEANS FOR CONTROLLING THE ELECTROMAGNETIC OUTPUT POWER OF ELECTRO-OPTIC SEMICONDUCTOR DEVICES

[75] Inventors: Vera B. Gorfinkel, Saratov; Serge A. Gurevich, Leningrad, both of U.S.S.R.

[73] Assignee: Biota Corp., Locust Valley, N.Y.

[21] Appl. No.: 815,174

[22] Filed: Dec. 31, 1991

[51] Int. Cl.$^5$ .................................... H01J 40/14
[52] U.S. Cl. .................. 250/214 C; 372/34; 257/184; 257/23
[58] Field of Search ............. 250/214; 359/246, 248; 357/30; 372/34, 36, 45, 46; 257/184, 23

[56] References Cited

U.S. PATENT DOCUMENTS 5,081,633  1/1992  Danner ............................ 372/45
5,119,393  6/1992  Oka et al. ........................ 372/45

Primary Examiner—David C. Nelms
Assistant Examiner—Que T. Le

[57] ABSTRACT

The output electromagnetic power of optoelectric heterojunction semiconductor devices having an active semiconductor layer with a mobile charge-carrier plasma is controlled by applying a microwave electric field inside the active layer by means of at least two semiconductor contacts to the active layer that are conducting to at least one type of mobile charge carrier and blocking to another type of charge carrier. An electrical signal is applied inside the active layer to transform the distribution of energies and equivalent temperature of the charge carriers of the mobile charge-carrier plasma in order to control light emission and absorption in the active layer. A heterojunction semiconductor laser is disclosed with two sets of electrical contacts: one to apply pumping currents and the other to control the electric field. Operating modes of the heterojunction devices are discussed which include high frequency (up to 100 GHz) modulation of the electromagnetic output of the laser, formation of picosecond optical pulses, and simultaneous amplitude modulation and mixing two signals by controlling synchronously the intensity, period and phase of pumping current and electric-field inside the active layer.

14 Claims, 2 Drawing Sheets

METHOD OF AND MEANS FOR CONTROLLING THE ELECTROMAGNETIC OUTPUT POWER OF ELECTRO-OPTIC SEMICONDUCTOR DEVICES

BACKGROUND OF THE INVENTION

1. Field of the Invention

The invention relates to high frequency, high bit-rate, optoelectric (photonic) heterojunction devices and more particularly, to controlling the equivalent temperature of the energy distribution function of the mobile charge-carrier plasma and gain in the active layer of the heterojunction in order to control the electromagnetic output power.

2. Description of the Prior Art

Optoelectric semiconductor devices that emit electronic radiation are used extensively today for applications such as, for example, fiber-optic telecommunications and laser printers. These devices include light-emitting diodes (LED) and the diode laser. Other such devices detect and modulate optical signals generated by an external radiation-emitting oscillator, while others convert optical electronic radiation into electrical energy. The theory and operation of these devices are well understood in the art as was discussed in the book "Physics of Semiconductor Lasers" by S. M. Sze, Chapter 12, p. 736, pub. by John Wiley & Sons, New York, 1981.

Furthermore, as also described in the book by Sze, Chapter 12, Sec. 12.5.1, referenced above, heterostructure with low threshold current density have been designed by the use of: —"carrier confinement provided by the energy barriers of higher bandgap semiconductor surrounding the active region, etc." More recently, small, efficient quantum well optoelectronic switching devices, such as the optical modulators and switches that were described in the article entitled "Quantum Well Optoelectronic Switching Devices" by D. A. B. Miller, Int. J. of High Speed Electronics vol. 1, No. 1, pp. 19-46, March 1990, are capable of logic themselves and have potential for integration, and in the article entitled "Advances in Optoelectronic Integration" by O. Wade, Int. J. of High Speed Electronics, vol. 1, No. 1, pp. 47-71, March 1990 which reviewed the latest advances in optoelectronic integration. Furthermore, in the article entitled "Analysis of Semiconductor Microcavity Lasers Using Rate Equations" by G. Bjork and Y. Yamamoto, IEEE J. of Quantum Electronics, vol. 27, No. 11, pp. 2386-2396, November 1991, equations that might achieve microcavity lasers with higher modulation speeds than previous devices were theoretically considered.

Devices for optical power modulation, such as described above, can be divided into two groups: active and passive devices. Active devices radiate electromagnetic power simultaneously with modulation and passive devices only modulate the radiation that passes through them. In all these devices, high frequency and high pulse rate modulation of optical power is the problem of importance in optical communication and high data rate system.

However, it is well known in the art that at present the maximum effective modulation bandwidth is limited to about 10 GHz for semiconductor lasers and to about 1 GHz for light diodes (Sze referenced above). Consequently, to investigate the limits on bandwidth, V. B. Gorfinkel and I. I. Filatov, in the article entitled "Heating of an Electron Gas by an hf Electric Field in the Active Region of a Semiconductor Heterolaser" Sov. Phys. Semicond. vol. 24, No. 4, April 1990, investigated theoretically the influence of the heating of electron gas by an electric field E(t) in the heterostructure AlGaAs, GaAs, AlGaAs on the optical gain. We considered only the energy balance equation and the carrier density rate equations in order to determine theoretically the influence of electric field $E(t)=E_0+E_1 \sin(2\pi ft)$ on the optical gain. Indeed, our theoretical analysis indicated that (where f is the applied signal frequency and ut is time) depending on the ratio of the variable and constant components of the heating fluid $E_1$ and $E_0$, the optical gain value may theoretically be modulated both at signal frequency f and at double frequency 2f up to f=400 GHz!. But, this theoretical analysis (Gorfinkel & Filatov above) did not consider any actual lasing operation and did not take into account any rate equation for light. Thus, our initial theoretical analysis encouraged us to proceed further with a new analysis and, if promising, to investigate new methods that might overcome the bandwidth problems associated with the prior art.

Subsequently, as described in the article entitled "High Frequency Modulation of Quantum Well Heterostructure Diode Lasers by Carrier Heating in Microwave Electric Field" by S. A. Gurevich et al., Joint Soviet-American Workshop on the Physics of Semiconductor Lasers, p. 67, May 20-Jun. 3, 1991, our more complete theoretical analysis that considered the laser equations among others revealed that the optical gain of a quantum well heterostructure can be modulated by a spacially controlled microwave electric field when the field is applied by semiconductor contacts to the active layer. Our results were particularly surprising because Takamize et al. in Proc. IEEE vol. 56, No. 1, p. 135, 1968, failed in their early attempts to modulate laser output by placing samples in a microwave waveguide. Thus our method, which includes controlling the period and spatial distribution of the electric field inside the active layer, appears to have overcome the problems of the prior art.

SUMMARY OF THE INVENTION

It is an object of the invention to extend frequency bandwidth of active and passive optoelectronic heterojunction semiconductor devices about 50 GHz.

Another object is to provide optoelectric heterojunction devices with output pulses in the picosecond range.

Another object is to modulate and to heterojunction two signals at frequencies above 50 GHz.

More particularly, we found that when a periodic electric field is applied inside the active layer of an electronic heterojunction device by contacts that are conducting for one type and blocking for another type of the mobile charge carrier, the equivalent energy-distribution-function temperature of the mobile charge carrier plasma is increased and the optical gain of the active layer is decreased at a relaxation response time in the picosecond range. Furthermore, we found that, by controlling spatially and temporally the electric field applied to the mobile charge carrier of the plasma inside the active area, the temperature and spatial energy distribution of the charge carriers can be selectively controlled to modulate the electromagnetic output and, when the phase of the electric field and pumping current signals are controlled, to generate picosecond output pulses.

DETAILED DESCRIPTION OF THE PREFERRED EMBODIMENTS

Figure 1:
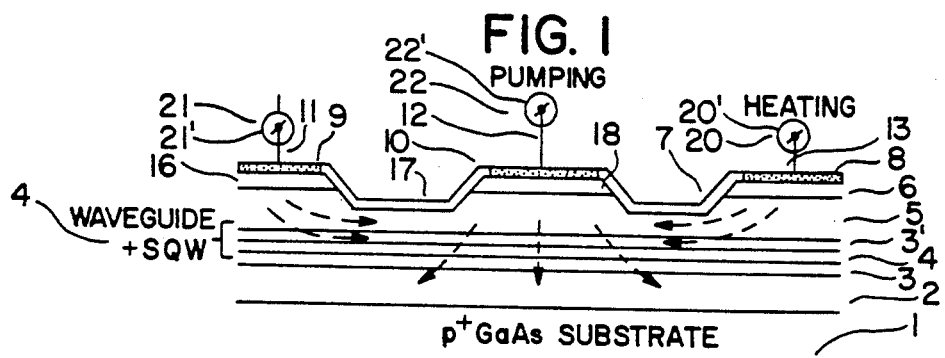
FIG. 1 is a cross-sectional view of an optoelectric heterojunction laser with semiconductor contacts for controlling the electric field inside the active layer.

FIG. 1 shows a schematical cross-constructional view of one embodiment of the invention. Here, a heterojunction single quantum well laser includes a p+ GaAs substrate 1, a p-type laser 2 of wideband AlGaAs semiconductor, and a quantum well narrow bandgap active layer 4 positioned between two wide bandgap layers 3 which form a waveguide. Also, n-type wideband AlGaAs layer 5 and n+ layers 6, 16 of heavily doped GaAs provide ohmic contacts to one type of mobile charge carrier plasma (electrons) in active layer 4 and to block hole current. Metallic contacts 8 and 9 to ohmic contacts 6, 16 are dielectrically isolated by ridge guide grooves 7, 17 from pumping contact 10 which makes ohmic contact through heavily doped n+ layer 18 to the active layer 4. Signals 20', 21' from signal generators 20, 21 are connected through leads 13, 11 to metal electrodes 8, 9, to control the electric field transversely (parallel) inside active layer 4, and signal 22' from signal generator 22 is connected to metallic contact 10 to pump the mobile charge carrier plasma in active layer 4 through doped n+ layer 18. Also, pumping current may be supplied by signal 24' from signal generator 24 connected through lead 14 to metal terminal 15 which is connected ohmically through p+ substrate 1 and p-layer 2 to active layer 4.

The laser shown in FIG. 1 is fabricated in the following way: the AlGaAs/GaAs layers forming the heterostructure, single quantum-well (SQW) laser are grown by MBE on p+ GaAs substrate 1. The thickness of the quantum well active layer 4 is about 100A, and the waveguide layer's thickness, including layers 3, 3', is 0.2 $\mu$m. As illustrated in FIG. 1, the ridge guide structure is formed by etching in the doped n+ layers 6, 5 two parallel grooves, each of 4 microns width, separated by 6 microns, which is the ridge width. The surface of the grooves 7 and 17 are then covered by SiO$_2$ films by conventional deposition techniques. Then, the laser illustrated in FIG. 1 may be operated by applying synchronously signals from separate signal generators 20, 21, 22, 24 in order to control the electric field inside active layer 4 and the pumping current.

Figure 2:
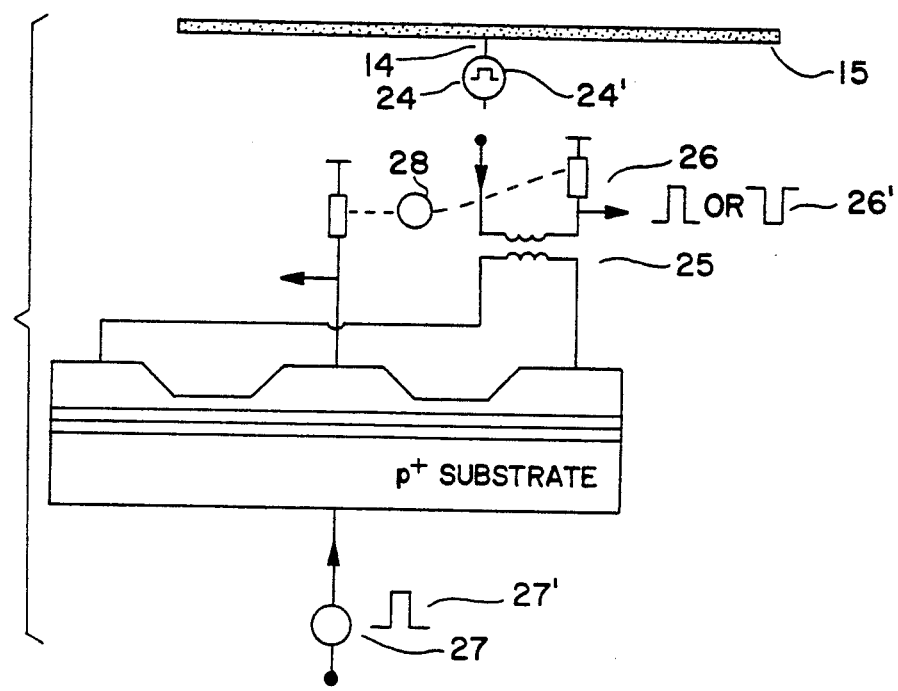
FIG. 2 is a schematic drawing of a circuit with electric signals synchronously controlled between the electric field-control and pumping current contacts.

Alternatively, as illustrated schematically by FIG. 2, a high frequency transformer 25 is connected between leads 13, 11 so that signal 26' from signal source 26 is applied to contact terminals 8, 9, thereby controlling periodically and spatially the electric field inside active layer 4. Also, a pumping signal 27' from power source 27 is applied between contact electrodes 10, 15, to control the period and intensity of pumping. The phase between signals 26' and 27' is controlled by phase controller 28.

The laser shown in FIG. 1 operates as follows: pumping current, when connected to the signal sources shown in FIG. 2, is applied to contacts 10, 15, causing spontaneous emission in active layer 4 and lasing when the pumping current exceeds threshold. Then, signal 27' is applied between terminals 11, 13, to control the electric field inside active layer 4 and concomitantly to increase the equivalent temperature of the energy distribution and the mobile charge-carrier plasma and to decrease the optical gain. Other effects of the electric field include a shift in laser output power vs. pumping current, as described below in connection with FIG. 3.

Figure 3:
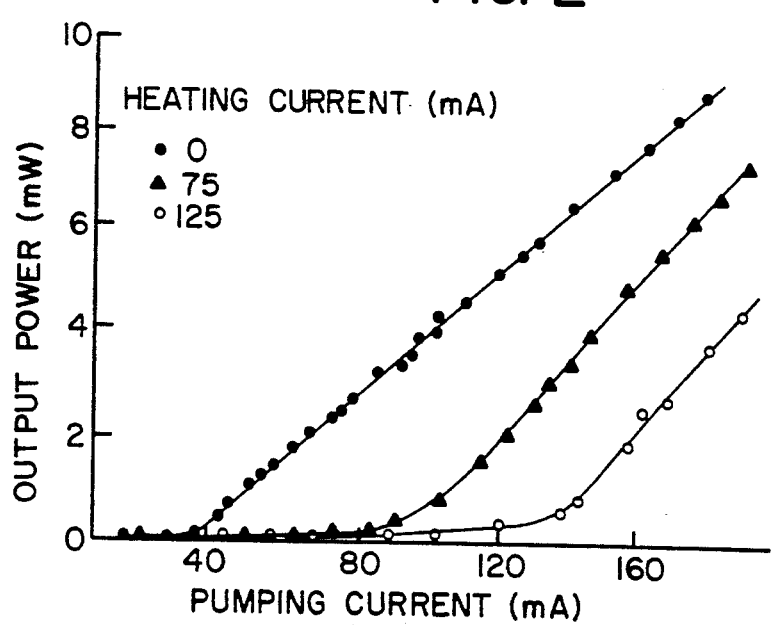
FIG. 3 shows the dependence of laser output power vs. pumping current at different controlled electrode-currents.

More specifically, FIG. 3 illustrates the electromagnetic laser output power vs. pumping current for constant heating currents of 0, 75 and 125 mA when synchronized 100 ns current pulse signals 26' and 27' are applied with a repetition rate of 40 kHz to contact terminals 9, 10 in the device shown in FIG. 1. The circuit shown in FIG. 2 is used to synchronously control the "heating" electric field and the pumping current. The "heating" current-voltage relationship measured at contact electrodes 8, 9 is linear and, with a 400 micron length of active layer 40, the resistance is about 100 ohms at zero pumping signal 27'. On the other hand, we found that the pumping current measured between electrodes 10, 15 was relatively unaffected by the "heating" current induced by the electric field applied between electrodes 11, 13. Thus we found that the lasing threshold and optical gain are advantageously controlled by synchronously controlling the intensity and phase of the pumping current and the electric field components inside the active layer 4.

Figure 4:
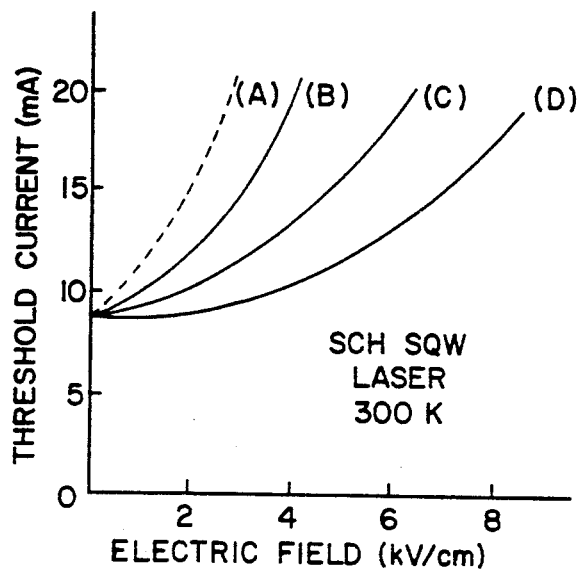
FIG. 4 is the calculated dependence of AlGaAs-GaAs single quantum well laser (SQW) laser threshold current on the electric field. Low-field electron mobilities are: (A) (B) 8000, (C) 4000, (D) 1200 cm$^2$/Vs.

Next, the laser output response to the short 5 ns heating current pulse is shown in FIG. 4. The laser shown in FIG. 1 was initially driven above the threshold to the output power of 8 mW. Under the heating current pulse (150 mA peak value) the laser output is suppressed practically to zero. With the 14 $\mu$m gap between the contacts 8, 9, the estimated electric field applied to the free carrier plasma is about 6 kV/cm in this experiment. About 100% modulation efficiency of the laser output has been obtained also with 4 GHz alternating current signal when the laser was driven at twice the threshold. Thus, the results of these experiments show a novel way to efficiently modulate laser output.

In order to describe the effect of an electric field on stead-state and dynamic characteristics of the diode laser, we used a model based on laser rate equations and energy balance equation to describe the carrier heating $$\frac{dn}{dt} = \frac{J}{ed} - \frac{n}{\tau_s} - \frac{c}{N} g(n,T) S, \quad (1)$$

-continued
$$\frac{dS}{dt} = \Gamma \frac{c}{N} g(n,T)S - \frac{S}{\tau_p} + \Gamma \frac{\beta n}{\tau_s}, \quad (2)$$

$$\frac{dT}{dt} = \frac{2}{3k} e\mu(n,T)E^2(t) - \frac{T-T_0}{\tau_e(n,T)}, \quad (3)$$

where n and S are the carrier and photon densities, respectively, E(t) is the applied electric field, u(n,T) is the mobility, T is the temperature of electron-hole plasma, $T_o$ is the lattice temperature, and $r_e$(n,T) is the energy relaxation time. As conventionally used, t is time, e is electron charge g is gain and $\Gamma$ is conductivity. The dependence of the optical gain g on carrier concentration and electron-hole plasma temperature was calculated assuming Fermi distributions for both types of carrier and step-like density of states in the QW active layer. The energy (and polarization) dependent matrix elements for the interband optical transitions were taken similar to those used by D. Ahn & S. Chung in IEEE J. Quantum Electron. QE-26 1 13, 1990. The energy relaxation time $r_e$ and the momentum relaxation time $r_k$ determining the electron mobility have been calculated by Monte-Carlo technique as published by V. B. Gorfinkel & S. G. Shafman in Sov. Phys. Semicond. 22 5 500, 1988. In these calculations the carrier interaction with polar optical phonons was assumed to be the major scattering mechanism. Generally, equations (1), (2) and (3) have to be solved self-consistently and this is the subject for numerical calculations. But in the frame of small-signal analysis, some useful results can be obtained in the analytical form as discussed below.

In the steady-state case, we have calculated the dependence of laser threshold current on heating electric field applied in the direction parallel to the active layer plane. The results are shown in FIG. 4 showing Threshold current vs. Electric field for low-field electron mobility of: (A), (B) 8000 cm²/Vs. (C) 4000 cm²/Vs (D) 1200 cm²/Vs. In the calculations we used the parameters corresponding to the AlGaAs/GaAs single quantum well (SQW) laser structure described above in connection with FIG. 1. For the solid curves plotted in FIG. 4 the parameter is the low-field electron mobility. The dashed cured corresponds to the case when the hole heating was not regarded and the hole temperature was assumed to be equal to the lattice temperature (300 K). The main result illustrated by FIG. 4 is a sharp increase of the laser threshold current under the heating field ranging from 1 kV/cm to 6 kV/cm. In such fields, the excess temperature of the carrier is about 100-300 K, so that intervalley transitions and thermal emission processsses are not very important.

To characterize the dynamic behavior of a laser under the gain modulation by the free-carrier heating, we start with a small-signal approach to the equation (1)–(3). We consider the small-signal modulation by the electric field $E(t) = E_o + \delta$ Esin(wt) with alternating part aplitude $\delta E << E_o$. As a result, one may expect small variations of all the variables, in particular, those of the carrier concentration $\delta n << n_o$, where $n_o$ is the steady-state concentration. With this, the mobility and energy relaxation time can be treated as constant parameters and equation (3) can be solved independently for the carrier temperature response $\delta T$. Finally, to linearize the rate equations (1) and (2) was expand the gain $$g(n,T) = g(n_0,T_0) + \frac{\partial g}{\partial n} \delta n + \frac{\partial g}{\partial T} \delta T, \quad (4)$$

where the differential gain term $\delta g/\partial T$ describes the gain modulation by carrier heating.

As one can see from (3), the characteristic time for the carrier temperature response should be as short as a few picoseconds due to the small value of $r_e \approx 10^{-12}$s. However, the laser output response $\delta S$ which is of primary interest here, may be not so fast because it involves the carrier concentration variation controlled by the spontaneous lifetime $r_e \approx 10^{-9}$s.

For the amplitude modulation response, the small-signal analysis gives $$|\delta S(\omega)| = \frac{\tau_p}{\tau_s} \Gamma \frac{\partial g/\partial T}{\partial g/\partial n} \delta T A_T(\omega). \quad (5)$$

The frequency dependent part A (w) is $$A_T(\omega) = \frac{\omega_0^2(1 + \omega^2 \tau_s^2)^{\frac{1}{2}}}{[(\omega_0^2 - \omega^2)^2 + \gamma^2 \omega^2]^{\frac{1}{2}}}, \quad (6)$$

where $w_o$ is the electron-photon resonance frequency, y is the damping factor, both depending on the output power and structure parameters. For comparison the frequency dependent part $A_f(w)$, corresponding to the direct modulation is given by $$A_f(\omega) = \frac{\omega_0^2}{[(\omega_0^2 - \omega^2)^2 + \gamma^2 \omega^2]^{\frac{1}{2}}}. \quad (7)$$

Thus, in the case of small damping the $A_T(w)$ and $A_f(w)$ functions have maxima near the frequency $w_o$. The most important feature is that in the high frequency limit $A_T(w)$ is proportional to $w^{-1}$ while $A_f(w) \propto w^{-2}$. This strictly indicates that the modulation by carrier heating is very promising for high frequency operation.

Figure 5:
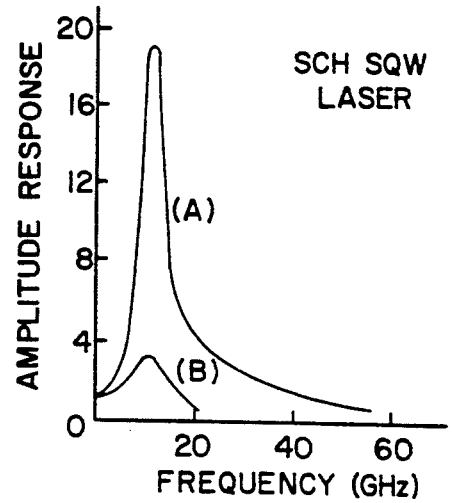
FIG. 5 is the calculated amplitude modulation responses of single quantum well (SQW) laser (A) modulation by carrier heating in alternating electric field $E(t) = E_o + \delta E \sin(2\pi ft)$; $E_o = 8.4$ kV.cm, $\delta E = 0.05 E_o$. Constant pumping current $I_o = 3h_h$. (B) direct modulation by pumping current $l(t) = l_o \delta l \sin(2\pi ft)$; $l_o 32\ 3\ l_{th}$, $\delta l = 0.05\ l_o$. Electric field is not applied: $E(t) = 0$.

For a quantitative example, we have calculated numerically the amplitude modulation response of a QW diode laser under the sinusoidal variation of heating electric field and that of pumping current. The results are plotted in FIG. 5. As shown in FIG. 5, both curves have a maximum at the frequency $f = w/2\pi \approx$ 10 GHz, which corresponds to the electron-photon resonance. In this case s of modulation by electric field, this resonance is more pronounced. Clearly, in the frequency range 20÷50 GHz, which is above the resonance, the modulation by carrier heating has a considerable superiority with respect to direct modulation such as used in prior art lasers.

In the quantitative sample given, above, the alternating component of electric field iE and that of current oI were taken to be 5% of their constant components. Nevertheless, the conditions of small-signal response were actually fulfilled in the low-frequency and high frequency ranges, but not in the vicinity of the resonance. Thus we solved the equations (1)–(3) numerically instead of using the formulas (6) and (7).

In contrast the direct modulation, the considered modulation of the optical gain by carrier heating is essentially a parametric process. Its parameteric nature results in a quite different amplitude response of a laser as shown in FIG. 6. Moreover, the effects of frequency mixing, harmonics excitation and period doubling can be observed in this case. The important feature of the laser output response to the alternating heating electric field is that the result strongly depends on the ratio of constant to alternating components of the applied field. For instance, if the constant component is zero, the modulation at the frequency f will lead to the output response at the frequency 2f. This frequency doubling is due to the simple fact that the effect of carrier heating does not depend on the direction of field vector in the active layer plane.

Figure 6A:
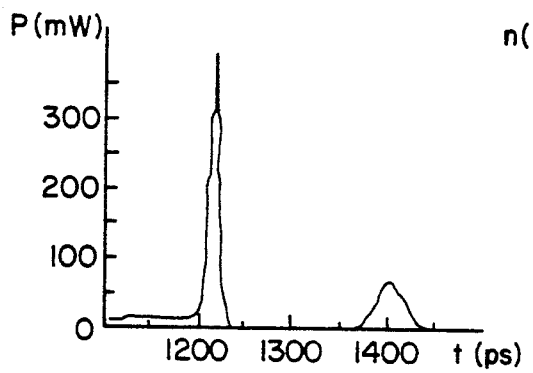
FIGS. 6A–6D (a) the reaction of laser output; (b) electron temperature; (c) carrier concentration; (d) gain on the abrupt step-like decease of heating electric field. The electric field amplitude $E_o = 8.4$ kV/cm; the pumping current $I = 1.5\ I_{th}$.
Figure 6C:
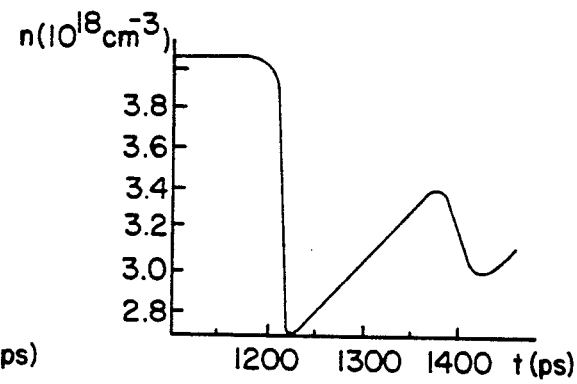
Figure 6B:
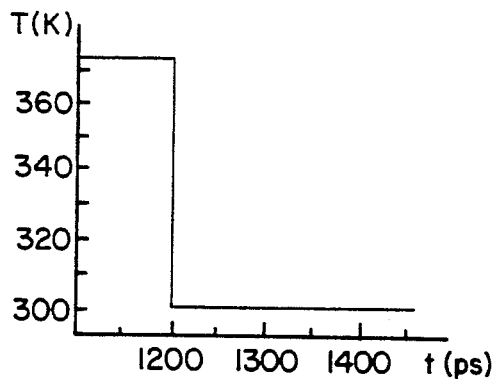
Figure 6D:
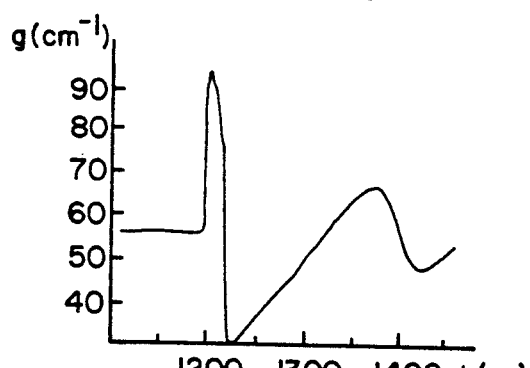

Furthermore, the potential of gain modulated lasers in high bit-rate systems is demonstrated by a numerical simulation of the laser reaction to a step-like variation of the heating electric field. If the laser is initially driven above the threshold, the reaction to the abrupt step-like increase of the applied electric field is a fast decrease of the output. In this case, the characteristic transient time is a few picoseconds determined by the carrier temperature rise and the photon lifetime in the resonator. Depending on the amplitude of the electric field step, the laser will be either switched off or brought into relaxation oscillations after the fast drop of the output. Somewhat more complicated is the laser output reaction to a step-like decrease of the heating field, as shown by FIG. 6 If the laser is initially above the threshold, the sequence of events will occur as follows. As a direct reaction to the switching off the heating field, the carrier temperature (FIG. 6b) will drop during a few picoseconds. Due to this drop, the optical gain (FIG. 6d) will rise initiating a fast increase of the output power (FIG. 6a). But the increasing photon density will start to consume the inversion, and hence the optical gain will start to drop. This process forms the back front of the optical pulse. The analysis shows that the duration of optical pulse generated in this process is determined by the ratio of the steady-state inversion concentration before the electric field step to that after the step. The example given in FIG. 6a demonstrates a 10 ps optical pulse.

Consequently, the preferred mode for high bit-rate modulation is the superposition of short negative pulses against a positive background of the heating field. Indeed, after such negative pulse, the return of the laser under the action of the heating field will suppress the relaxation oscillations being the source of bit error. The ability of the laser to respond to very high frequency periodic modulation by the electric field has utility for high-capacity optical communication systems. Using the simultaneous modulation by high frequency heating field and by pumping current at lower frequencies one may separate a number of channels by their carrying frequency. In this case all the advantages of the frequency multiplexing system can be employed. Also, other active and passive optoelectronic heterojunction devices may be combined with the method of and means for controlling the electric field described herein. Other optoelectronic devices, such as those described by Miller, Wada, and the Bjork & Yamamoto publications reference above, may be adapted to include the means for modulating an electric field as described herein in order to provide higher modulation speeds than those of prior art devices. Such devices that may be adapted to control the electromagnetic output power in accordance with the present invention include active and passive devices that: (a) generate; (b) modulate; and (c) detect optical signals generated by internal or external radiation emitted oscillators. Also, devices that convert electromagnetic radiation into electrical energy may be adapted in accordance with the present inventive concepts include: multi-quantum well lasers, LED's, modulators and switches capable of logic, integrated optoelectronic circuits, and microcavity lasers.

What is claimed is:

1. A method of controlling the output electromagnetic power of an optoelectric heterojunction semiconductor device comprising an active layer having a first conductivity type and a second conductivity type of mobile charge carriers, comprising the following steps:
    a. generating a density of said first conductivity type and a density of said second conductivity type of said mobile charge carriers in said active layer;
    b. applying an electric field inside said active layer to heat one conductivity type of said mobile charge carriers; and
    c. controlling the said density of said first conductivity type and the said density of said second conductivity type of said mobile charge carriers and the intensity, period, and phase of said electric field inside said active layer to control the emission of pulses of electromagnetic radiation from said mobile charge carriers.

2. The method of claim 1 in which said active layer is a quantum well consisting of a low bandgap semiconductor layer positioned between a first high bandgap layer and a second high bandgap layer.

3. The method of claim 2 in which said active layer comprising said quantum well is a multiple quantum well.

4. The method of claim 1 including contact means for applying an electric field inside said active layer and in which said contact means for applying said electric field to said active layer comprises first and second field control contacts comprising doped semiconductors of the same conductivity type in conducting contact with one conductivity type of said mobile charge carriers and in clocking contact with the other conductivity type of said mobile charge carriers in said active layer.

5. The method of claim 4 in which a first signal from a signal generator means is electrically connected to said first and second field control contacts for controlling the said period, intensity and phase of said electric field.

6. The method of claim 5 in which said first signal, having a first intensity, period, and phase connected to said first and second field control contacts and a said second signal, having a second intensity period, and phase, is connected to said generation means to modulate said pulses of said output electromagnetic power.

7. The method of claim 6 in which said first signal and said second signal are synchronously controlled to modulate said pulses of said output electromagnetic power.

8. The method of claim 6 in which said intensity, period, and phase of said first signal and said second signal are synchronously controlled to produce pulsed electromagnetic radiation with a controlled pulse duration.

9. The method of claim 1 in which said heterojunction semiconductor device comprises a laser and said pulse of said electromagnetic radiation are controlled spatially and temporally by said electric field.

10. The method of claim 1 in which said heterojunction device comprises a light emitting diode and said pulse of said electromagnetic radiation are controlled spatially and temporally by said electric field.

11. The method of claim 1 including pumping contact means for generating said first conductivity type and said second conductivity type of said mobile charge carriers in said active layer and in which said pumping contact means for generating said first conductivity type and said second conductivity type of said mobile charge carriers comprises a first pumping contact comprising a doped semiconductor of one conductivity type applied to a first portion of said active layer and a second pumping contact comprising a doped semiconductor of a second conductivity type applied to a second portion of said active layer.

12. The method of claim 11 in which a signal from a first signal generator is electrically connected to said first and second pumping contacts for supplying pumping current to said active layer.

13. A high frequency, high bit-rate optoelectric semiconductor heterojunction device comprising in combination:
   a. an active layer having a first conductivity type and a second conductivity type of mobile charge carriers;
   b. pumping means for generating said first conductivity type and said second conductivity type of said mobile charge carriers in said active layer;
   c. heating electric field means for heating one conductivity type of said mobile charge carriers in said active layer;
   d. first signal means including means for controlling the intensity and period of said first signal for applying a first signal to said pumping means;
   e. second signal means including means for controlling the intensity and period of said second signal for applying a second signal to said heating electric field contact means; and
   f. means for synchronously controlling the said intensities, periods and phase of said first signal means and said second signal means.

14. A method of controlling the output electromagnetic power of an optoelectric heterojunction semiconductor device comprising an active layer having gain, a lattice temperature and a first conductivity type and a second conductivity type of mobile charge carriers with a statistical distribution of energies equated to an equivalent temperature, means for generating said first conductivity type and said second conductivity type of said mobile charge carriers in said active layer and means for heating one of said conductivity types of said mobile charge carriers inside said active layer, comprising the following steps:
   a. generating a density of said first conductivity type and a density of said second conductivity type of said mobile charge carriers in said active layer;
   b. heating one of said conductivity types of said mobile charge carriers to a temperature above said lattice temperature; and
   c. controlling said density and said temperature of one of said conductivity types of said mobile charge carriers to control the gain of said active layer.

* * * * *